United States Patent [19]

Barsky et al.

[11] Patent Number: 4,792,715

[45] Date of Patent: Dec. 20, 1988

[54] ROBOT GRIPPER CONTROL SYSTEM USING PVDF PIEZOELECTRIC SENSORS

[76] Inventors: Michael F. Barsky, 301 Wall St.; Douglas K. Linder, 510 Sunrise Dr., both of Blacksburg, Va. 24060; Richard O. Claus, Rte. 3, Christiansburg, Va. 24073

[21] Appl. No.: 121,645

[22] Filed: Nov. 16, 1987

[51] Int. Cl.$^4$ ............................................. H01L 41/08
[52] U.S. Cl. ................................... 310/316; 310/800; 294/86.4; 294/907; 414/730; 901/9; 901/10; 901/32
[58] Field of Search ............... 310/314, 316, 317–319, 310/328, 330–332, 800; 294/902, 907, 1.1, 99.1, 93, 86.4; 414/729, 730, 739; 901/9, 10, 2, 20, 23, 31–36, 38, 46

[56] References Cited

U.S. PATENT DOCUMENTS

| 4,565,940 | 1/1986 | Hubbard, Jr. | 310/316 X |
| 4,594,526 | 6/1986 | Araki et al. | 310/317 |
| 4,610,475 | 9/1986 | Heiserman | 310/800 X |
| 4,630,135 | 12/1986 | Sato | 310/332 X |
| 4,663,555 | 5/1987 | Yoshihiro | 310/317 |
| 4,667,997 | 5/1987 | Udagawa et al. | 310/332 X |
| 4,689,992 | 9/1987 | Strachan | 310/332 X |
| 4,727,277 | 2/1988 | Adams | 310/316 X |

Primary Examiner—Mark O. Budd
Attorney, Agent, or Firm—Larson and Taylor

[57] ABSTRACT

A robot gripper control system is disclosed which uses PVDF piezoelectric sensors to actively damp exerted force. Instead of charge amplifying the output of the piezoelectric transducer, the output voltage is measured as the charge drains across a path of low resistance. Thus, the sensor output is proportional to the rate-of-force exerted by the gripper. The PVDF sensor and a strain gauge are arranged in a proportional and derivative (PD) control system for the control of force of a robot manipulator hand. Experimental results for the particular disclosed gripper indicate that as much as a 900% improvement in force step response rise time and a 300% reduction in overshoot are possible through the use of the PVDF sensor.

14 Claims, 14 Drawing Sheets

EXPERIMENTAL STEP
RESPONSE TO PVDF SENSOR

ROBOT GRIPPER CONTROL SYSTEM USING PVDF PIEZOELECTRIC SENSORS

BACKGROUND OF THE INVENTION

The present invention relates to a robot gripper control system and more particularly to a control system which uses PVDF piezoelectric sensors to actively damp exerted force.

DESCRIPTION OF THE PRIOR ART

According to one aspect of the present invention, a piezoelectric material is used together with a strain gauge in a robot gripper control system. The piezoelectric material forms a sensor for feedback in the control system. It is known in the prior art to use piezoelectric materials in robot manipulators. U.S. Pat. No. 4,539,554, issued to Jarvis et al. on Sept. 3, 1985, discloses pressure transducers capable of producing an analogue output voltage representative of the applied pressure. Jarvis et al. disclose a piezoelectric material disposed between a ground plate and a silicon transducer. The amount of force applied through a compliant cover over the piezoelectric material to the silicon transducer is proportional to the sensing of the silicon transducer. The capacitance is stored at a node A associated with the transducing element, and may be interrogated by a sensing circuit located in the silicon substrate which yields a direct indication of the localized force applied to the sensor. Jarvis et al. disclose that the piezoelectric material may be the piezoelectric polymer polyvinylidene fluoride (hereinafter "PVDF").

U.S. Pat. No. 4,495,434, issued to Diepers et al. on Jan. 22, 1985 discloses a pressure-sensitive transducer for robot grippers. Diepers et al. refer to the use of transducers of piezoceramics or piezoelectric polymers such as PVDF.

U.S. Pat. No. 3,285,074 issued to Elazar on Nov. 15, 1966, discloses a piezoelectric transducer (accelerometer) which is dampened by a series of diodes. The system includes a cross-feedback arrangement using the output of one crystal as a reference with respect to a zenner diode and another crystal.

SUMMARY OF THE INVENTION

One object of the present invention is to provide a robot gripper system which uses a rate-of-force signal to actively damp exerted force.

Still another object of the present invention is to provide an improved robot gripper system which has an improved force step response rise time.

Another object of the present invention is to provide an improved robot gripper system which reduces gripper overshoot by the use of a rate-of-force signal.

According to another aspect of the present invention, we provide a robot gripper system having a gripper mechanism used to engage an object. A motor is used for operating the gripper mechanism. Further, a force sensor means is provided to provide a force signal proportional to the amount of force applied by the gripper mechanism to the object. A control circuit receives the force signal and controls the gripper motor. A further sensor means is provided for producing a rate-of-force signal proportional to the rate of the application of the gripper force to the object. Also, circuit means are provided to utilize said rate-of-force signal as a negative feedback to the control circuit for the gripper motor.

According to still another aspect of the present invention, the sensor means for producing a rate-of-force signal proportional to the rate of the application of the gripper force to the object comprises a PVDF piezoelectric sensor.

In accordance with a further aspect of the present invention, we provide a robot gripper control system for controlling the operation of a motor which, in turn, operates a gripper having a gripper surface used to engage an object. According to this aspect, the control system comprises a first sensor means for providing a first signal proportional to the integrated force exerted by the gripper surface on the object being engaged. A second sensor means is provided for providing a second signal proportional to the rate-of-force exerted by the gripper surface on the object being engaged. In addition, a control circuit is provided for operating the gripper motor, the control circuit comprising amplifying means for providing a control signal to control the operation of the motor, first means for providing the first signal as a negative feedback, second means for providing the second signal as a negative feedback and mixer means connected to said amplifying means for providing a mixed signal to the amplifying means comprised of the first and second signals.

It should be understood that other objects and advantages of the present invention will be readily appreciated by reference to the following detailed description when considered in connection with the accompanying drawings.

DESCRIPTION OF THE DRAWINGS

FIG. 3a is an isometric view, with portions broken away, of a piezoelectric sensor according to one embodiment of the present invention.

FIG. 3b is an enlarged view of a portion of FIG. 3a.

DESCRIPTION OF THE PREFERRED EMBODIMENT

Polyvinylidene fluoride ("PVDF") is a piezoelectric polymer which shows great promise as a sensor for robot systems. According to the present invention, this material is used for robot gripper control. The piezoelectric sensor functions as a rate-of-force sensor for derivative feedback, while a strain gauge senses the integrated force exerted upon the entire gripping surface. The sensors are used together in a proportional and derivative (PD) control system. The benefits afforded by the additional sensory feedback have been evaluated by comparing the performance of a gripper with and without the piezoelectric sensor.

Robot gripper control is the control of the force integrated over the gripping area. The integrated force is directly related to the important issue of gripper compliance control. Furthermore, control in terms of force sharply focuses attention on benefits provided by the piezoelectric sensory feedback. This problem is consistent because most gripping problems are concerned with the fast, accurate application of force. Compliance control could also be defined in terms of the finger position and velocity, or in terms of both force and position. Gripper control may also depend on static variables such as object orientation.

We have found PVDF to be troublesome for absolute force feedback due to output drift and temperature sensitivity. Others have shown that use of extremely thin piezoelectric films and temperature compensation may make piezoelectric sensor practical for absolute force measurements. See P. C. Chen, R. S. Muller and R. M. White, "Thin Film ZnO-MOS Transducers with Virtually dc Response," *Proceedings IEEE Ultrasonics Symposium*, Nov. 1980; D. L. Polla, R. S. Muller and R. M. White, "Pyroelectric Properties and Application of Sputtered Zinc Oxide Thin Films," *Proceedings IEEE Ultrasonics Symposium*, San Francisco, Calif., 1985; A. J. Bur and S. C. Roth, "Development of a Polymer Pressure Gage with Temperature Compensation," *National Bureau of Standards Interim Report*, Contact No. 82-64, 1982. Piezoelectrics, however, function quite naturally as rtte-of-force sensors. No current integration or high impedance voltage amplifiers are required. One must simply measure the voltage output of the transducer as the charge drains across a path of low resistance. If a piezoelectric sensor and an integrated force sensor are used together, force and damping should be simultaneously controllable as in a classical PD control system where the position variable is force, and the velocity variable is rate-of-force.

The control problem addressed by our invention is the maximization of the rise time of a step change in force under the constraint of zero overshoot. This problem is specified in terms of step response rise time and overshoot because the most demanding gripper applications require fast response time and generally cannot tolerate overshoot. The step function is the most difficult encountered in practice, and the most practical in view of speed maximization. The step response analysis presented here is confined to consideration of changes from one nonzero low level of force to another high force level. However, experimnntal results are reported which demonstrate the possible extensibility of the results to the control of nonlinear impact forces.

Figure 1:
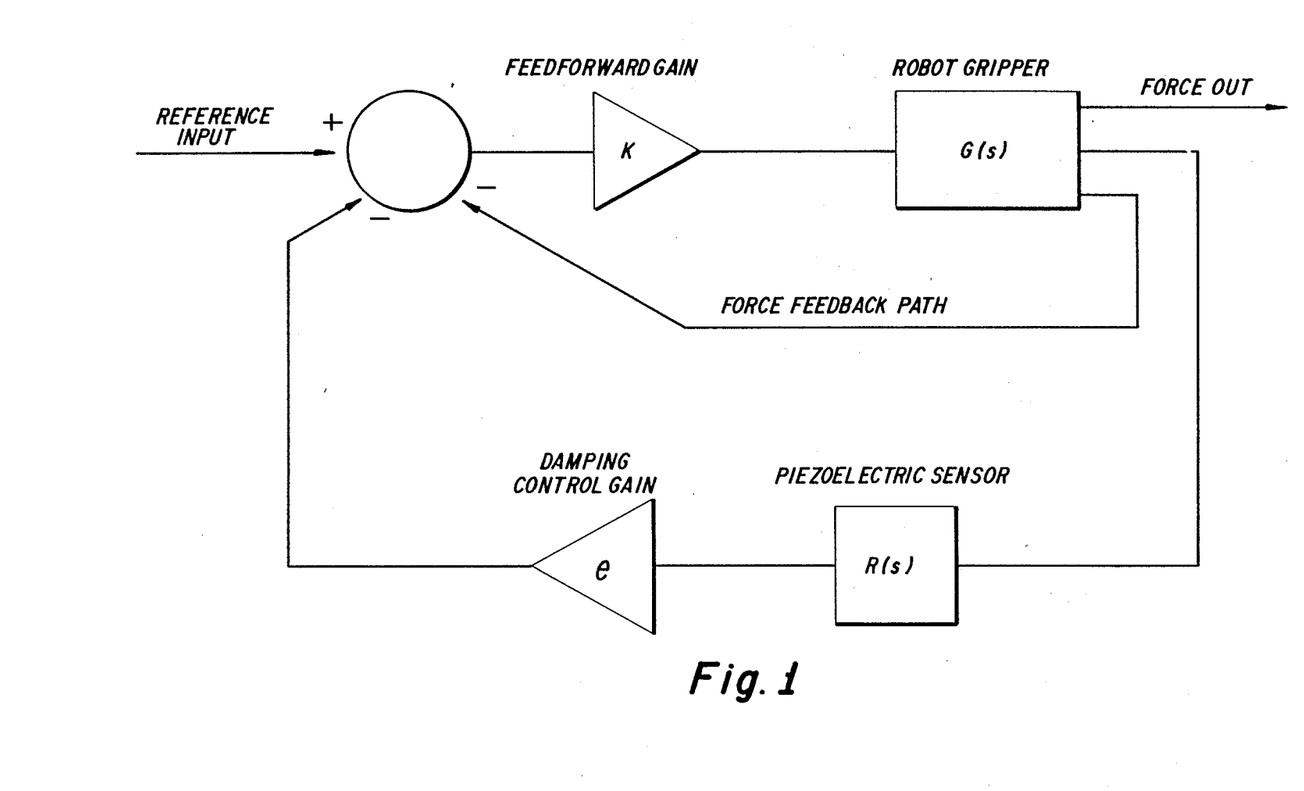
FIG. 1 is a schematic block diagram of a robot gripper control system according to one embodiment of the present invention.

The robot gripper, sensors, and control system are shown graphically in the block diagram in FIG. 1. The transfer function $G(s) = $ (Output Force/Input Voltage) represents the dynamic coupling between the voltage input of a pulse-width-modulated power amplifier, DC permanent magnet motor, the robot gripper mechanism, and the force sensor. The pulsed power amplifier is required to boost the signal power and to reduce nonlinearities introduced by commutator voltage drop in the drive motor The piezoelectric force sensor is represented by the transfer function $R(s) = $ (Output Voltage)/(Input Force). The gains K and e are the respective scalar feedforward and rate feedback gains.

The gripper on a commercially available manipulator Rhino XR-1, selected for this experiment, is similar in design to many popular industrial grippers. It is position locking in that forces exerted on the gripping surfaces are isolated from the dc electric drive motor when the motor is turned off. Position locking grippers tend to be more efficient than back-drivable grippers in which steady state forces are not isolated from the drive motor. The instrumented fingers of the gripper are shown with mounted sensors and an object C in FIG. 2. Only one piezoelectric B and one force sensor A are used experimentally because the gripper applies forces symmetrically to both fingers. The force sensor A is a silicon strain gauge commercially available from Transensory Devices. This sensor is selected for its excellent linearity, low hysteresis, absolute accuracy, and commercial availability.

Figure 2:
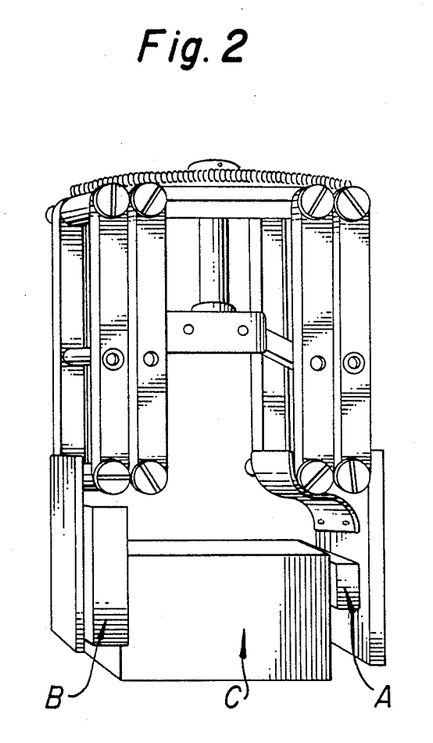
FIG. 2 is an isometric view of a robot gripper according to one embodiment of the present invention.

The piezoelectric polymer PVDF is an ideal piezoelectric for rate-of-force sensing because of its strong low Q response, ease of use, and compliance, properties which are lacking in most non-polymeric piezoelectric. The sensor B is mechanically designed to reject stretch mode response, while allowing the thickness (compression) mode response.

Figures 3A, 3B:
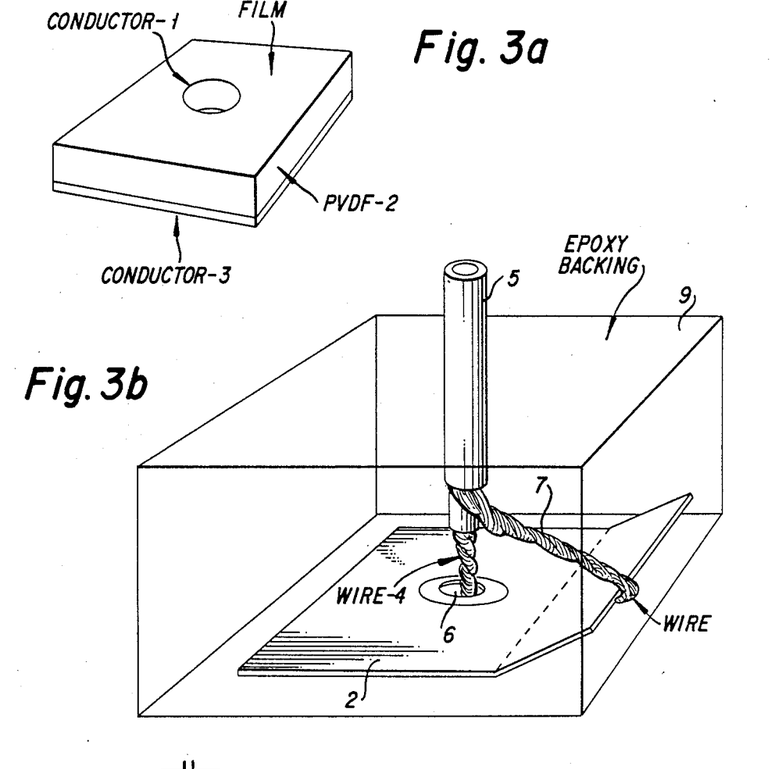

All but a small circular spot of a conductor 1 is etched away on one side of a rectangular piece of PVDF film 2 as shown in FIG. 3a. The opposite side of the film is completely covered by the conductor 3. The inner conductor 4 of a short piece of high gauge coaxial cable 5 is connected to the conducting spot using conductive epoxy 6. One edge of the film is bent upward, and the outer conductor 7 of the coaxial cable 5 is attached to the front surface at the bend. Finally, the sensor is potted in non-conducting epoxy 9 with the conducting surface of the film facing outward (downward) as shown in FIG. 3b. The coaxial cable 5 and grounded front surface provide excellent shielding (40 dB S/N), while the potting epoxy provides support for the cable connection and the film. This construction technique is a modification of the technique described by Dario for piezoelectric array sensors. See J. S. Schoenwald, "Strategies for Robotics Sensing Using Acoustics," *Proceedinqs IEEE Ultrasonics Symposium*, San Francisco, Calif., Oct. 16-18, 1985. Dario's technique, however, requires a special feed-through circuit board for support and electrical connection.

Figure 3C:
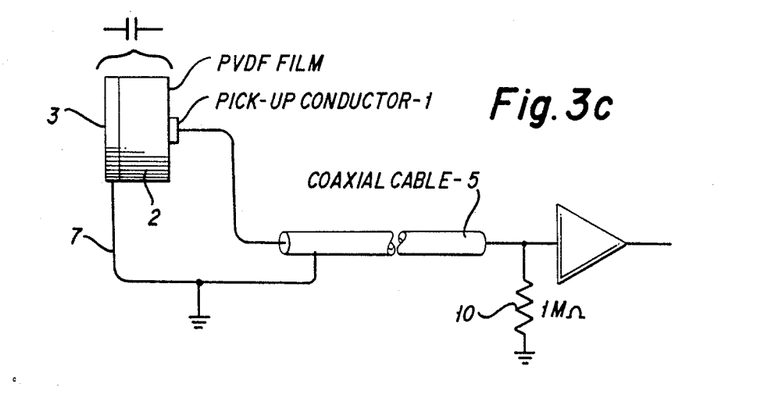
FIG. 3c shows a rate-of-force sensor means according to one aspect of the present invention.

As best illustrated in FIG. 3c, the coaxial cable 5 is connected to a nearby amplifier which buffers the voltage signal across a 1 megaohm input resistor 10. The capacitance of the film is approximately 10 pF. The input resistor 10 and this capacitance form a first-order bandpass network with a resonate frequency of approximately 20 kHz. Since the step response rise time of the sensor is 20 microseconds, the bandwidth of the bandpass network is only slightly wider than that of the sensor. This band-limiting damps high frequency noise, and places an upper limit on the rate at which the derivative can change if it is to be detected accurately. The wide bandwidth of the piezoelectric sensor is of importance in its application as a rate-of-force sensor. The output of the strain gauge, for instance, could not be differentiated and used for rate feedback because of its narrow bandwidth; regardless of noise issues.

An output force to input voltage transfer function model for the gripper, G(s), and an input force to output voltage model of the rate sensor, R(s), are obtained to permit the evaluation of the theoretical closed-loop performance. Both models are determined from their step response in the time domain.

The transfer function of the gripping mechanism, G(s), was identified from experiments performed on the open loop plant and a closed-loop proportional (no rate feedback) control system. Closed loop experiments on the system indicated that two additional assumptions could be made. First, the system can track step inputs without steady state error. This indicates that the system is at least type 1. Secondly, the system is capable of closed loop instability. The feedforward gain level which causes instability is measured experimentally. This indicates that the order of the denominator of the transfer function should be at least three orders of magnitude higher then the numerator. Thus, the model should be of the form shown in (1).

$$G(s) = \frac{k(s + a_1)(s + a_2) \ldots (s + a_n)}{s(s + b_1)(2 + b_2) \ldots (s + b_{n+3})} \quad (1)$$

Figure 4:
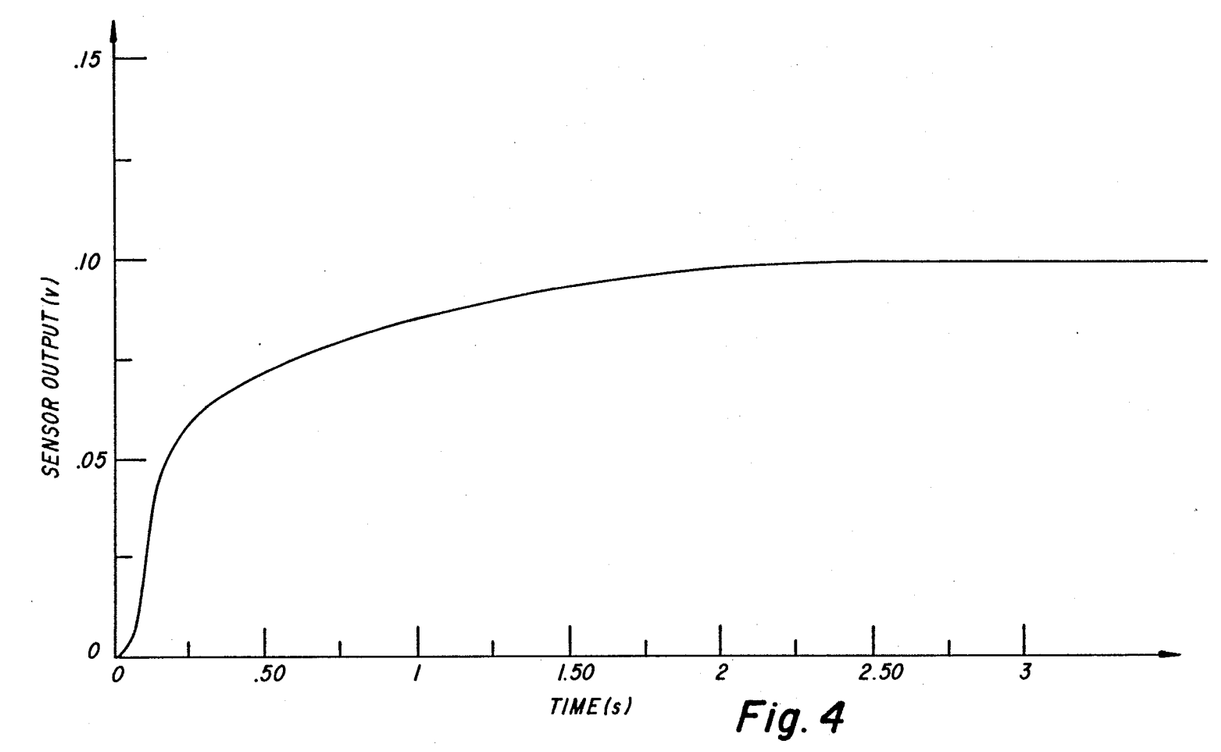
FIG. 4 is a graphic illustration of experimental open-loop step response of the gripper.

The force sensor output resulting from a 7-volt step input is shown in FIG. 4. The model is constructed in a step wise-iterative process to approximate the dominant response while incorporating the above mentioned facts about the closed loop performance. First, the most important components of the response are modeled: the rise from zero to 50 millivolts, and the rise from 50 to 100 millivolts. Those components are modelled as the sum of an exponential and an integral term as shown in FIGS. 5a and 5b.

Figure 5:
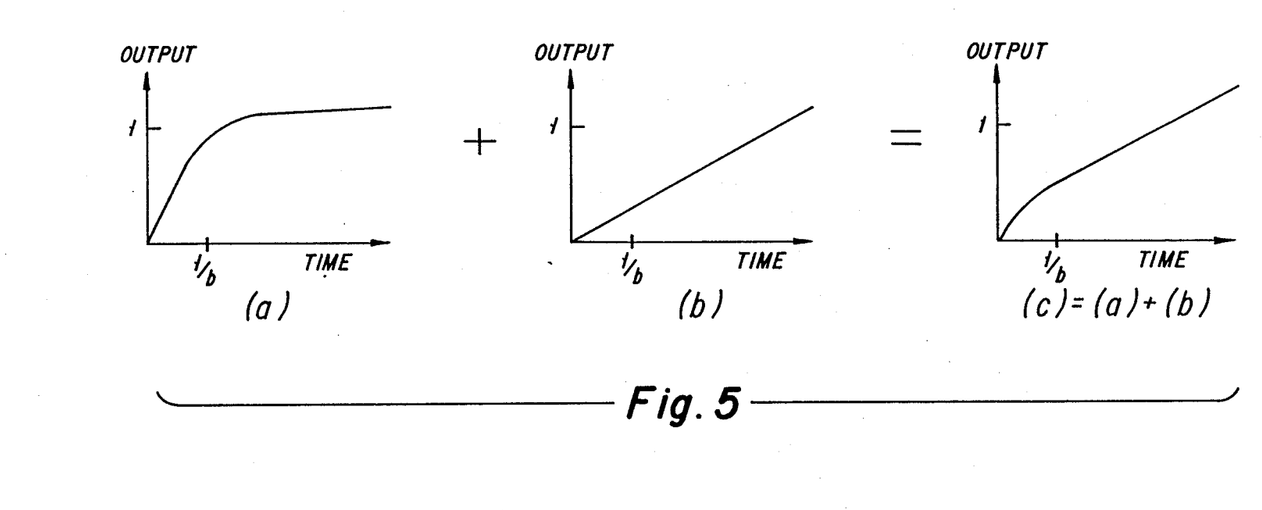
FIGS. 5a, 5b and 5c graphically illustrate the component of a model according to the present invention.

FIGS. 5a and 5b can be represented in the frequency domain as the sum of the Laplace transforms of each part. Multiplying by s to account for the step input yields the preliminary transfer function shown in (2).

$$G(s) = \frac{b_1}{s(s + b_1)} + \frac{k_1}{s^2} = \frac{k(s + a_1)}{s(s + b_1)} \quad (2)$$

The resulting response is shown in FIG. 5c. This figure has nearly the same form as FIG. 4, but lacks the slight initial curvature and final flattening. The final flattening is the result of torque saturation in the motor. If the force exerted by the gripper in confined to low levels, the motor torque will never saturate due to the position locking effect of the gripper mechanism. Therefore, in closed loop operation, this final flattening will never occur. The model could be extended to high levels of force near motor stall using an integral compensator with torque dependent gain. High level forces are not required for the experiments considered herein, so integral compensation is not required.

The model in (2) is not yet in the form required by (1). Since the numerator is first order, two additional poles must be chosen. One pole is found by iteratively matching the initial curvature to that of FIG. 5a. The last pole is found using the Routh-Hurwitz stability criterion and the fact that the closed loop response becomes unstable when the feedforward gain K rises above 500. After scaling, the final transfer function is shown in (3).

$$G(s) = \frac{830 (s + 5.2)}{s(s + 100)(s + 50)(s + 15)} \quad (3)$$

Figure 6:
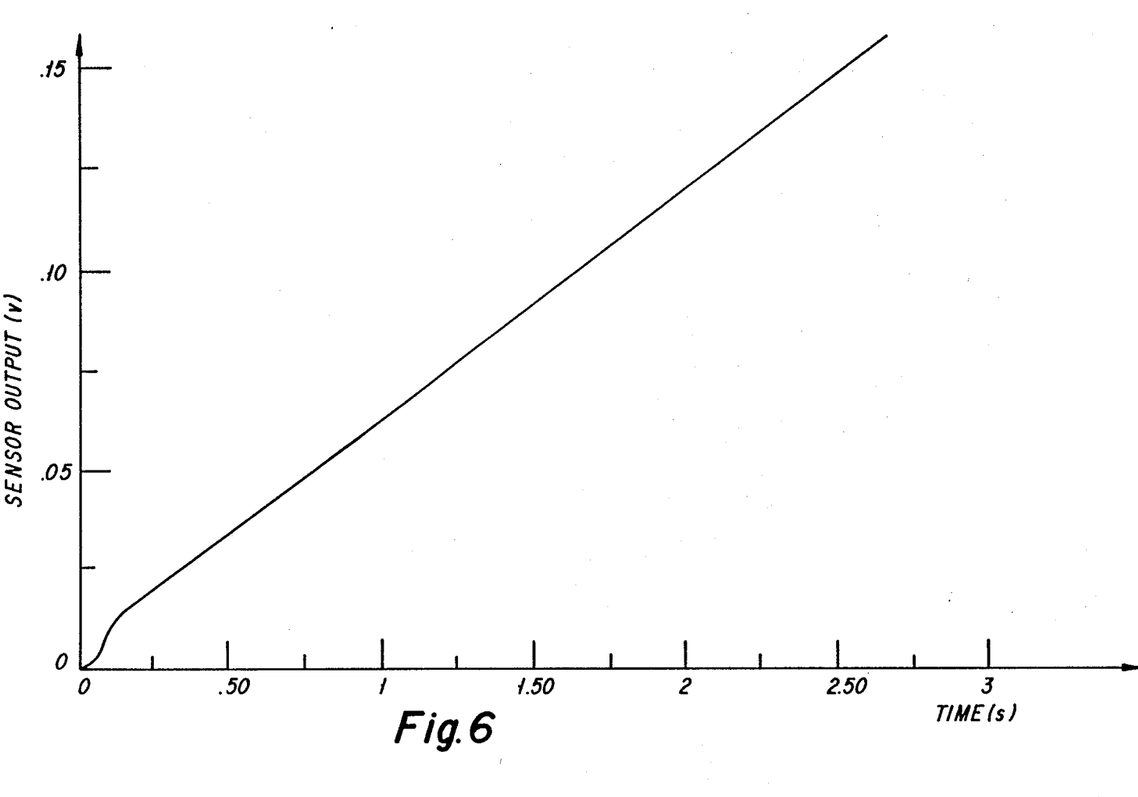
FIG. 6 graphically illustrates the calculated open-loop step response of the model.

A plot of the theoretical step response is shown in FIG. 6. Note that the model given in (3) is already in its simplest form. No further simplifications are possible without sacrificing all ability to predict the relative stability of the closed loop system. Friction nonlinearities make higher order transfer function models meaningless.

The rate sensor R(s), is also modelled from its step response. The step response rise time of piezoelectrics is extremely fast. The simplest step actuation technique of sufficient speed available is the pencil point break technique first developed by Hsu to simulate a source of acoustic emission. See W. Sachse and N. N. Hsu, "Ultrasonic Transducers for Material Testing and Their Characteristics," in *Physical Acoustics*, Vol. 14, W. P. Mason and R. N. Thuston, eds., New York: Academic Press, 1979. When a thin lead (0.5 mm) pencil point is broken, the force exerted by the lead drops to zero in less than a microsecond. Knowledge of the exact value of the input force is not essential because it can be identified later. The most important part of the response is the initial rise, as will be shown.

Figure 7A:
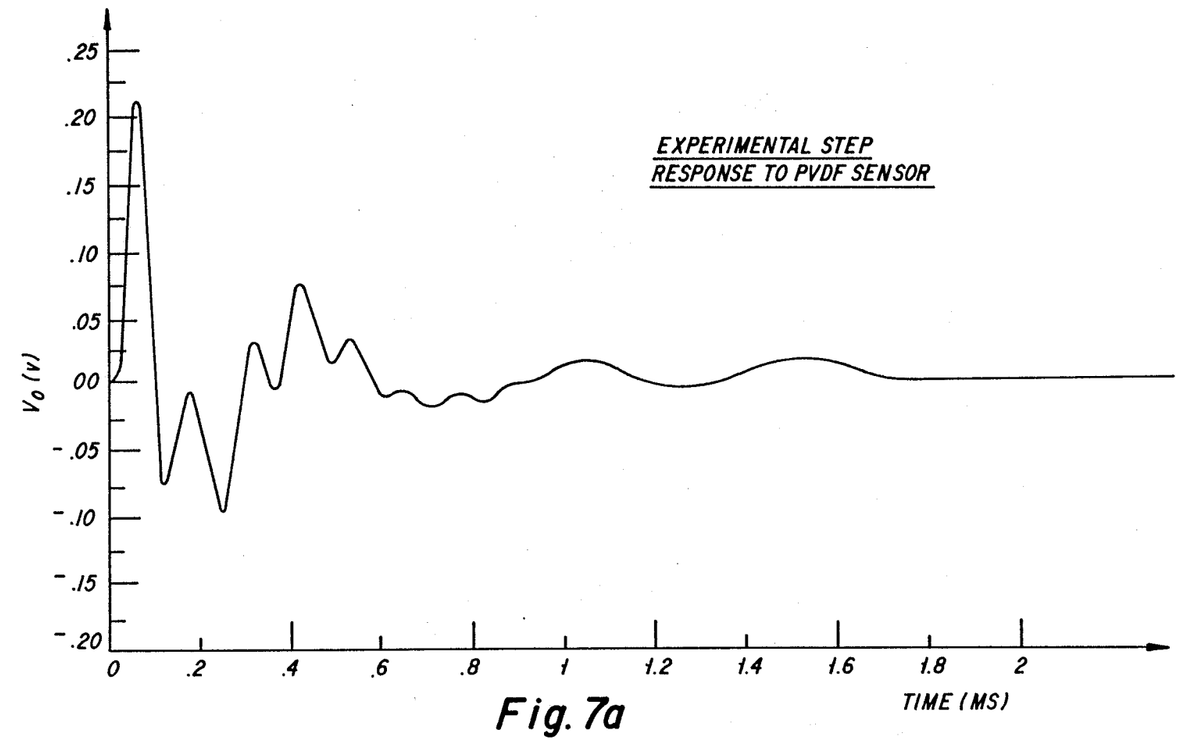
FIG. 7a is a graph illustrating the experimental step response of a PVDF rate sensor using the pencil point break step response technique.

The step response of the PVDF film across a 1 megaohm resistor is shown in FIG. 7a. This response can be broken into two parts:
(1) a 25 kHz high-frequency mode, and
(2) a 2 kHz low-frequency mode.

The low frequency mode is associated with oscillation of the surface after the unloading process. In the gripper system, the sensor will be used to sense impact forces, and changes in force after contact is established. Therefore, the sensor will have some surface loading up until the object is to be released. Hence, the low frequency mode is ignored in the modelling procedure. The high-frequency response resembles the step response of a second order bandpass filter with an undamped natural frequency of $40 \times 10^3$ rad/sec, and a damping ratio of 0.3. Using these facts as parameters, the transfer function (4) is derived.

$$R(s) = \frac{10^6 s}{s^2 + 1.4 \times 10^4 s + 1.6 \times 10^9} \quad (4)$$

Figure 7B:
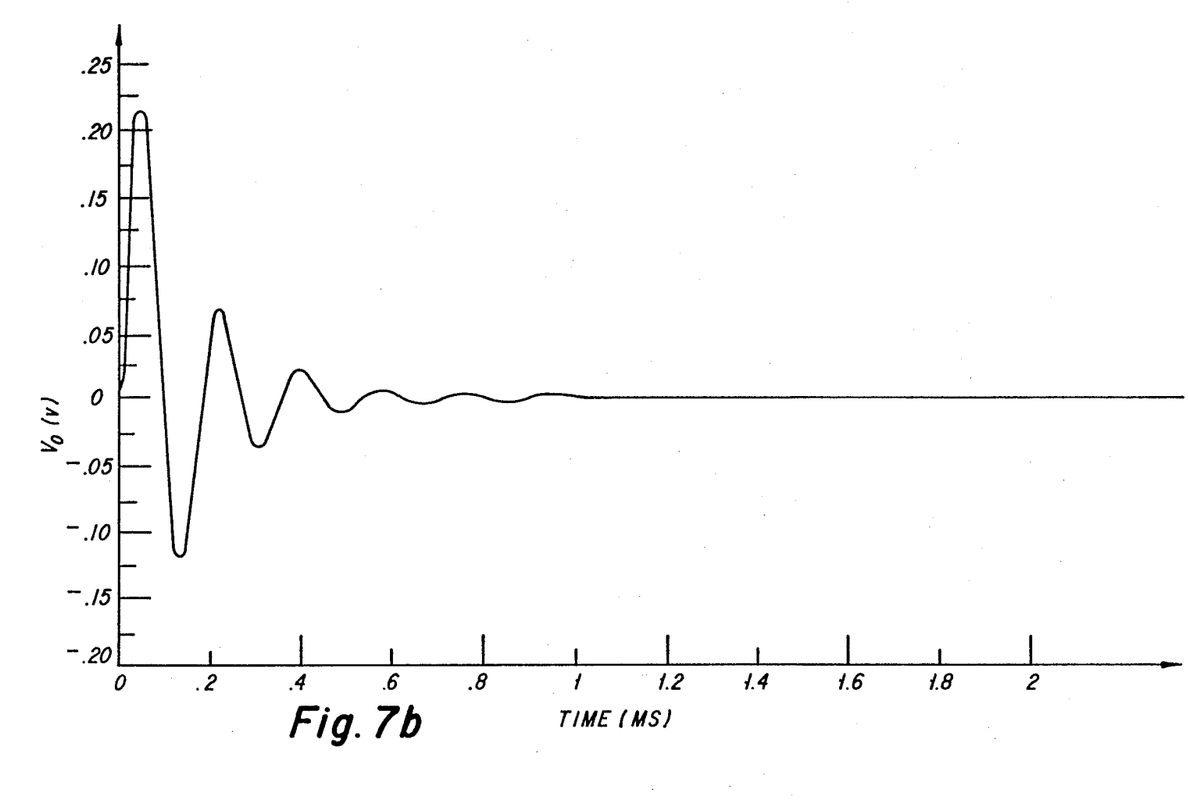
FIG. 7b is a graphic representation of the theoretical response of the PVDF sensor calculated from the model.

The response of this filter is plotted in FIG. 7b.

We have conducted tests which compare the performance of the gripper control system with and without rate feedback. The results are divided into theoretical and experimental parts. In both parts two basic tests are performed. The first test in each part demonstrates the ability of the additional feedback to prevent overshoot during a step transition in force. The second test compares the fastest achievable rise times with and without rate feedback. The description of the experimental results also reports an impact test using the PD control system.

Theoretical Results

Step responses are calculated using the transfer function models as discussed above.

Test b: This first test is designed to demonstrate the ability of the PD control system to prevent overshoot during a step response. The rate feedback gain e is first set to zero. The feedforward gain K is raised to a value (300) which causes overshoot in the response as shown in curve (a) of FIG. 8. At this feedforward gain, the overshoot is 25 percent, and the settling time is 200 ms. If the feedforward gain K were increased further, the overshoot would grow larger, and the settling time would be longer. Next, without changing feedforward gain K, the rate feedback gain e is raised to a value (25) which reduces the overshoot to a smooth monotonic response as shown in curve (b) FIG. 8.

Figure 8:
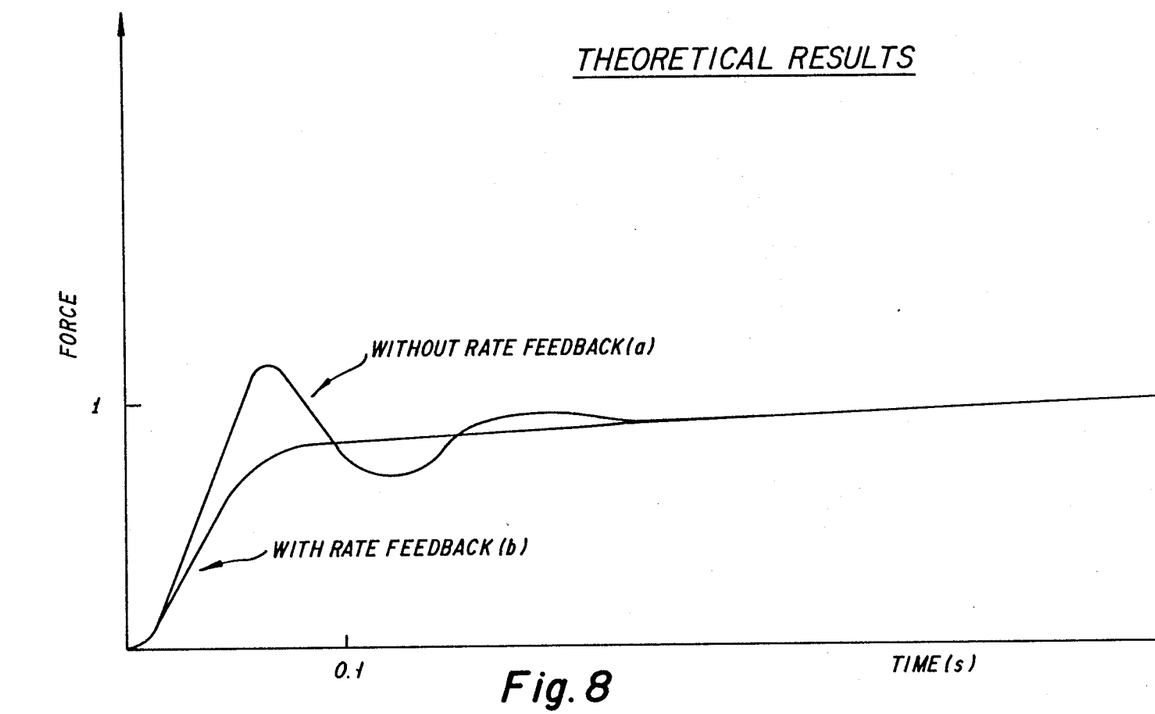
FIG. 8 is a graphical representation of the theoretical test of the ability of the rate feedback sensor to surpress overshoot with or without rate feedback.

The rise time in both cases is the same, but because oscillation about the steady state value are eliminated, the settling time is reduced to only 150 ms when rate feedback is included. Therefore, the models indicate that overshoot can be damped through rate feedback without sacrificing speed.

Figure 9:
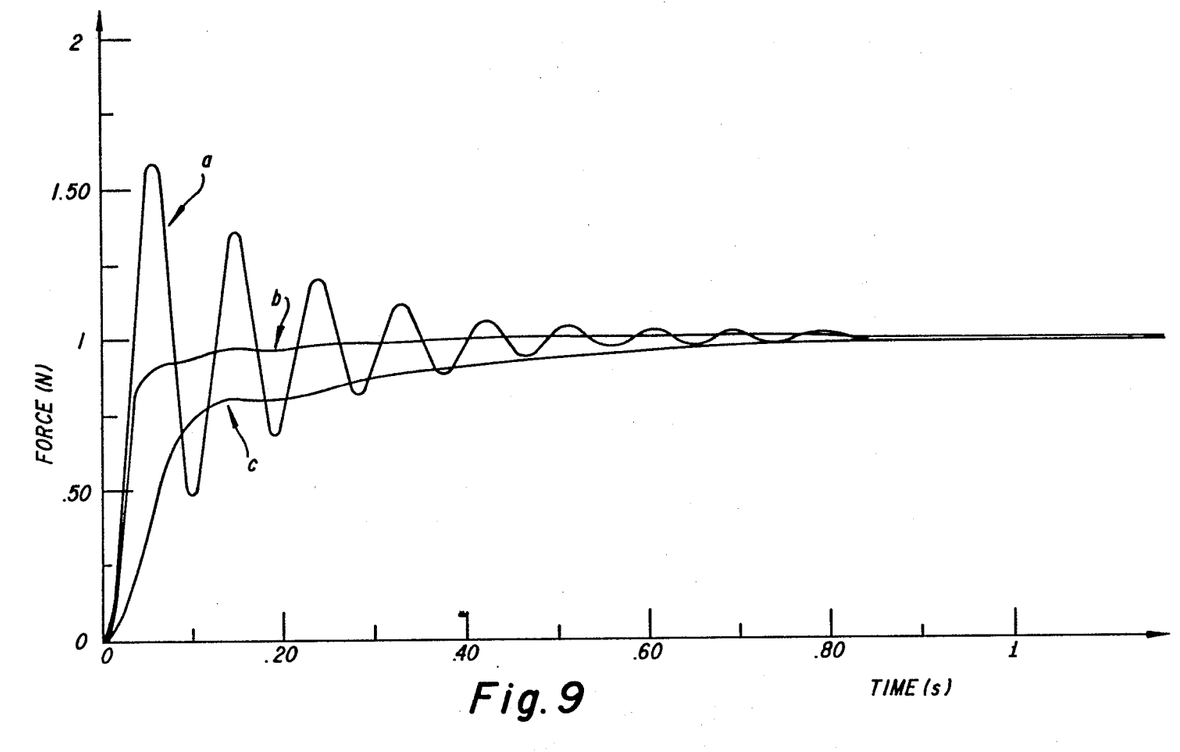
FIG. 9 is a graphical representation of a theoretical test of the speed enhancement of an undamped response, a damped response using rate feedback, and a damped response using friction.

Test 2: This test demonstrates the response speed enhancement attainable using the PD control system. Since the PD control system allows the damping to be increased as the feedforward gain is increased, much higher feedforward gains may be used without overshoot. Curve (a) of FIG. 9 shows the step response of the proportional system (rate gain e=0) when the feedforward gain is set such that the response is nearly unstable (K=500). The overshoot is force is 60 percent, and the settling time is 700 ms. If the rate feedback is raised to 30, all overshoot is eliminated, and the rise time is reduced to 60 ms as shown in curve (b) of FIG. 9. This is approximately the fasted rise time predicted by the theory.

Higher feedforward gains require significantly higher rate feedback gains which tend to overdamp the response to such an extent that linger rise times result. For purposes of comparison, curve (c) of FIG. 9 is included to show the fastest rise time achievable without any rate feedback. Here the rise time is 500 ms. Curve c is actually the fastest monotonically increasing response without rate feedback. (The constraint of monotonicity is added to make the results more realistic. In the actual control system, if no rate feedback is used, all damping must come from friction. In practice, most non-monotonically increasing responses lead to actual overshoot due to friction nonlinearities.) A comparison of responses in curves b and c indicates that an order-of-magnitude improvement in response speed may be possible.

Figure 10:
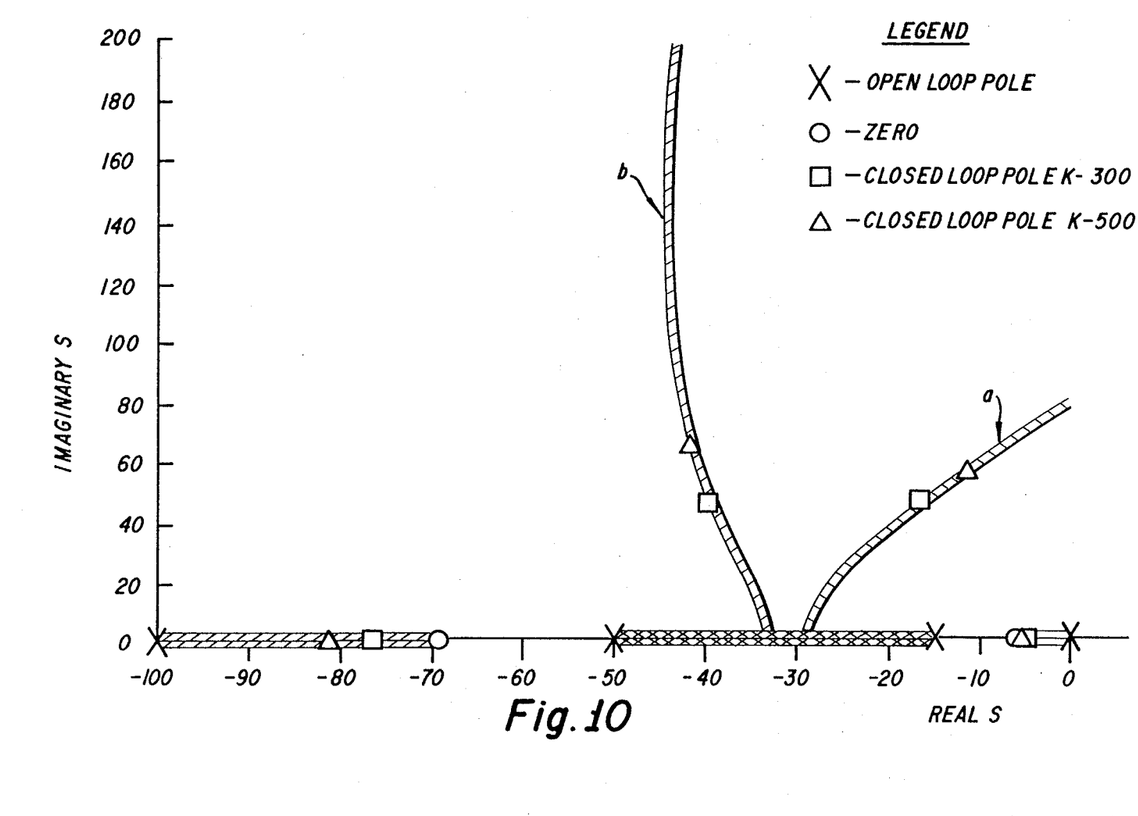
FIG. 10 is a graphical representation of the root loci of a proportional control system and a PD control system.

Test 1 indicated that if the feedforward gain was held constant, the feedback gain could be adjusted independently to set the damping to a desired level. In fact, the damping can be set over a wide range, and can even be used to reduce the friction inherent in the gripper by changing the sign. The stabilizing effect of the rate feedback is clear upon examination of the root loci of the two systems. FIG. 10 shows the superimposed root loci with and without rate feedback for the above two cases. The dominant poles move significantly closer to the right half plane as the feedforward gain is raised from 300 to 500 in the proportional control system, while in the PD control system, the poles move away from the right half plane as the gain is raised.

This shows that the rise time of the system can be reduced with rate feedback. Also note that the zeta of the dominant complex poles increases sharply from zeta=0.3219 to zeta=0.2132 as the gain is increased in the proportional control system. However, it is only from zeta=0.625 to zeta=0.608 slightly increased in the PD control system. This 550% difference accounts for the dramatic reduction of the overshoot by the use of a rate sensor.

Experimental Results

The theoretical results reported above were experimentally tested using the hardware described in connection with FIGS. 1-3. This output force is detected by the feedback force sensor, recorded on a digital oscilloscope, and the results presented are plotted from the oscilloscope.

Figure 11:
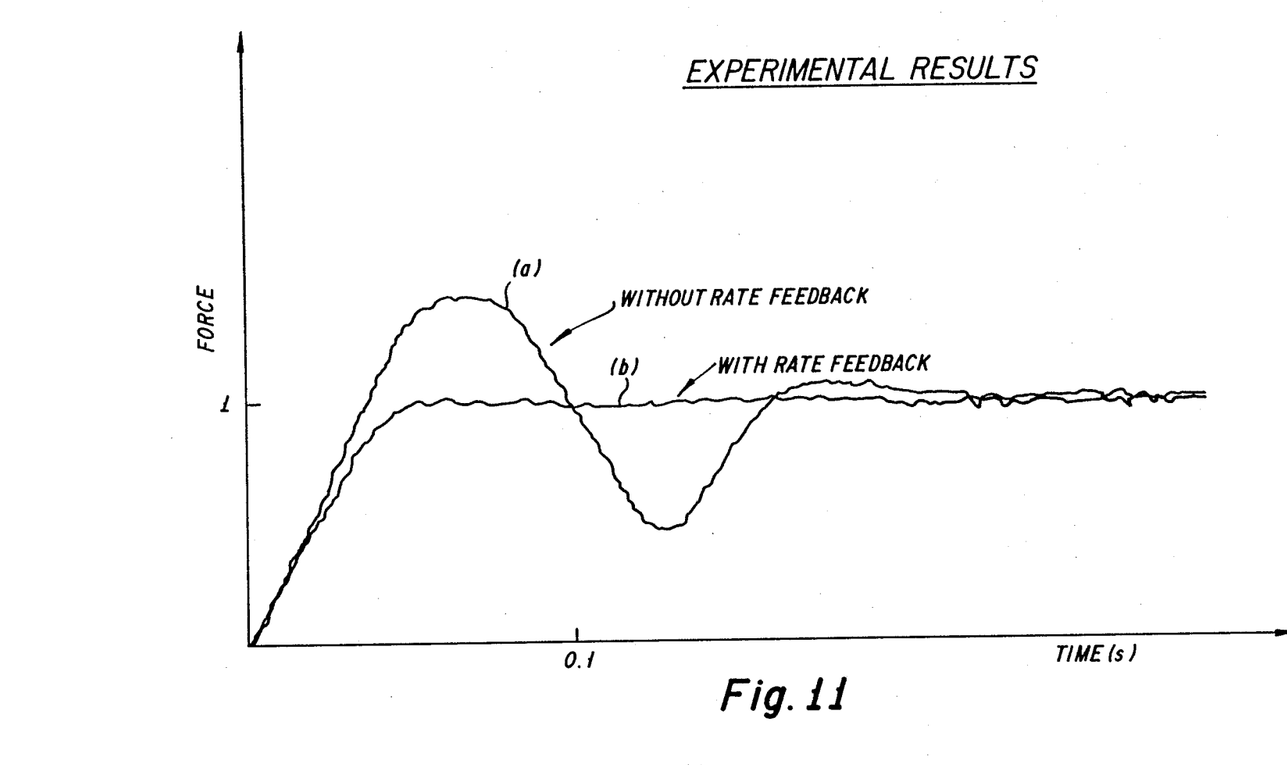
FIG. 11 is a graphical representation of an experimental test of the ability of the rate feedback sensor to surpress overshoot with or without rate feedback.

Test 1: Curve (a) of FIG. 11 shows the step response when the feedforward gain is adjusted as in the first theoretical test without rate feedback. The response shows larger oscillations than were present in the theoretical test, but rise time and settling time are roughly the same. This discrepancy is probably caused by frictional effects which are not included in the model of the gripper.

When rate feedback is included (same feedforward gain), the overshoot is completely suppressed as shown in curve (b) in FIG. 11. As in the theoretical response, the rise time is virtually unaffected by the additional feedback, and the settling time is reduced.

Test 2: In this part, the maximum response speed with and without rate feedback is experimentally determined. First, the most rapid response without rate feedback is determined by the criteria outlined above in test 2 of the theoretical results. This response is shown in FIG. 12b to have a rise time of 2 seconds.

Figure 12:
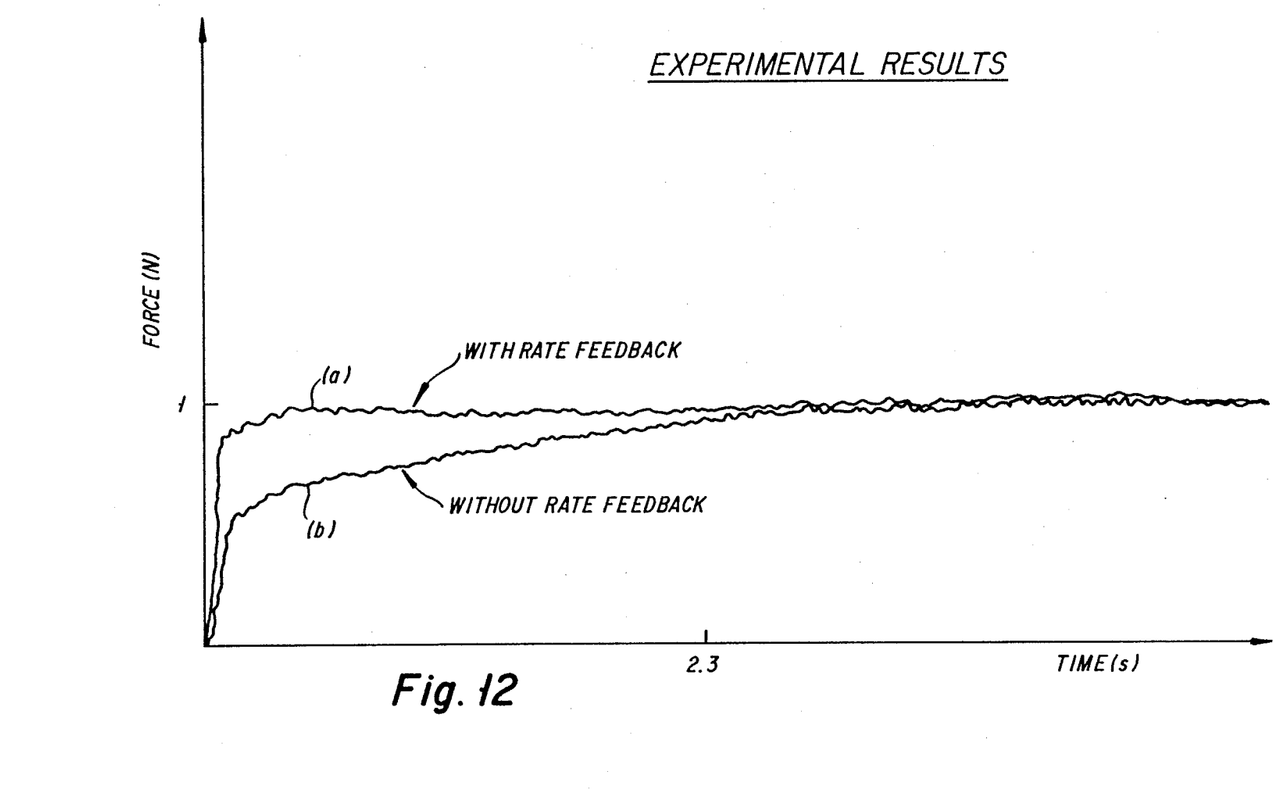
FIG. 12 is a grahhical representation of an experimental test of the speed enhancement response with the feedforward and feedback gains adjusted simultaneously and the best response without rate feedback.

Next, the feedforward gain and rate feedback gain are increased together to achieve the minimum step response rise time of 90 ms as shown in FIG. 12a. Thus, experiment indicates that the response time can be improved by more than an order of magnitude using rate feedback.

Figure 13:
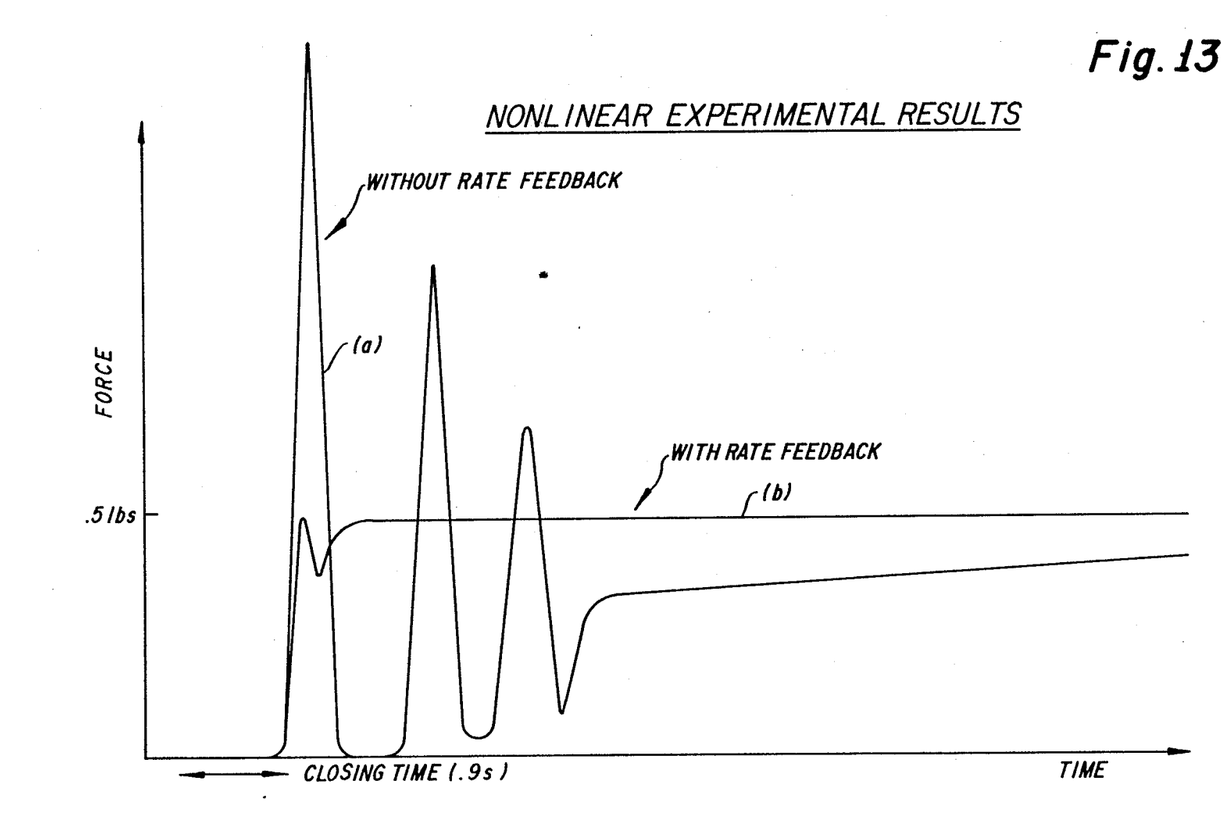
FIG. 13 is a graphical representation of an experimental impact test showing step response with or without rate feedback.

Impact Test: We have conducted a nonlinear experiment which extends the above experimental results to real life gripping conditions. In the above tests, the gripper was always in contact with the object with some small initial contact force. In the actual gripping processes, however, the gripper would usually close unimpeded until it makes contact with the object to be grasped. Curve (a) of FIG. 13 shows the step response when the wide open gripper closes with proportional feedback onto an object placed symmetrically between the fingers. The initial part of the response is zero because no contact exists as the gripper closes. Then the response jumps to more than 300 percent in overshoot, breaks contact with the object, and impacts again. The second impact is at lower initial velocity, and the response is damped by friction after 2 seconds. The response finally reaches steady state (not shown) after 10 seconds.

In contrast, the curve (b) of FIG. 13 shows the step response when the system is adjusted with the same feedforward gain as above, but rate feedback is included. This response exhibits only a few percent overshoot, and the settling time is 300 ms (after impact). Thus, the rate feedback should provide significant improvement in the performance under practical gripping conditions.

A robot gripper control system has been constructed and analyzed to evaluate the usefulness of piezoelectric rate-of-force sensor feedback in gripper force control. Rate sensing was shown to provide a method of actively damping the force exerted by the gripper. Specifically, the rate feedback was shown to be effective in suppressing overshoot occurring during step transition in force, and to improve the step response settling time by as much as an order of magnitude. A demonstration shows the possible extensiblity of the results to the damping of impact forces. Overall, it is apparent that significant advantages exist in the use of piezoelectric rate-of-force sensors in the control of robot grippers.

While preferred embodiments of the invention have been shown and described, it will be apparent to those skilled in the art that modifications can be made within the scope of the invention which is defined in the appended claims. Accordingly, the foregoing embodiments are t be considered illustrative only, rather than restricting the invention and those modifications which come within the meaning and range of equivalency of the claims are to be included herein.

We claim:

1. In a robot gripper system comprising a gripper mechanism used to engage an object, a motor for operating the gripper mechanism, force sensor means for providing a force signal proportional to the amount of force applied by the gripper mechanism to the object, and a control circuit that receives the force signal and controls the gripper motor, the improvement cmmprising:
    a further sensor means for producing a rate-of-force signal proportional to the rate of the application of the gripper force to the object; and
    circuit means for providing said rate-of-force signal as a negative feedback to said control circuit.

2. The robot gripper system as claimed in claim 1 wherein aaid further sensor means comprises a PVDF piezoelectric sensor.

3. The robot gripper system as claimed in claim 2 wherein said further sensor comprises a film of PVDF material, a face conductor on one side of said film, and a connector conductor on the other side of said film.

4. The robot gripper system as claimed in claim 3 wherein said further sensor further includes a coaxial cable, the inner conductor of which is rigidly connected to said connector conductor, and the outer conductor of which is rigidly connected to said face conductor.

5. The robot gripper system as claimed in claim 4 wherein said further sensor further includes a solid housing of a non-conducting material encapsulating said film and cable such that said face conductor is coplanar with the corresponding surface of said housing.

6. The robot gripper system as claimed in claim 5 wherein said further sensor film has a planar first portion and a second portion integral with said first portion, but extending away from the plane thereof; wherein said face conductor is coextensive with said film first portion and extends onto said film second portion; wherein said film first portion is coplanar with said housing corresponding surface; and said further sensor includes conductor means for connecting said coaxial cable outer conductor to ground.

7. A robot gripper control system for controlling the operation of a motor which in turn operates a gripper having a gripper surface used to engaged an object, the control system comprising:
    a first sensor means for providing a first signal proportional to the integrated force exerted by the gripper surface on the object being engaged;
    a second sensor means for providing a second signal proportional to the rate-of-force exerted by the gripper surface on the object being engaged; and
    a control circuit for operating the gripper motor, said control circuit comprising
        amplifying means for providing a control signal to control the operation of said motor,
        first means for providing said first signal as a negative feedback,
        second means for providing said second signal as a negative feedback, and
        mixer means connected to said amplifying means for providing a mixed signal to said amplifying means comprised of said provided first and second signals.

8. A robot gripper control system as claimed in claim 7, wherein said second signal providing means comprises further amplifying means for amplifying said second signal.

9. A robot gripper control system as claimed in claim 8, wherein said second signal providing means comprises means for adjusting the gain of said further amplifying means.

10. A robot gripper control system as claimed in claim 9 and further comprising means for adjusting the gain of said amplifying means.

11. A robot gripper control system as claimed in claim 10, wherein the gripper motor is a DC permanent magnet motor, and wherein said amplifying means comprises a pulse-width-modulated power amplifier that supplies regulated DC power to said gripper motor.

12. A robot gripper control system as claimed in claim 10, wherein said second sensor is comprised of a film of a piezoelectric material, a first conductor on one side of said film, and a second conductor on the other side of said film, said second sensor having a predetermined capacitance; and
    wherein said second providing means further includes an input resistor connected between said second sensor and said further amplifying means, said input resistor and said second sensor capacitance forming a bandpass network.

13. A robot gripper control system as claimed in claim 12, wherein said second sensor has a predetermined step response rise time, and wherein said input resistor is selected such that the inverse of the bandwidth of said bandpass network is about the same order of magnitude as said second sensor response rise time.

14. A robot gripper control system as claimed in claim 12, wherein said second sensor has a response bandwidth, and wherein the bandwidth of said bandpass network and the bandwidth of said second sensor are selected so as to be on about the same order of magnitude.

* * * * *